United States Patent
Adachi et al.

(10) Patent No.: US 12,362,746 B2
(45) Date of Patent: Jul. 15, 2025

(54) SEMICONDUCTOR DRIVE DEVICE AND SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kento Adachi, Tokyo (JP); Tatsunori Sakano, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 50 days.

(21) Appl. No.: 18/452,810

(22) Filed: Aug. 21, 2023

(65) Prior Publication Data
US 2024/0195408 A1      Jun. 13, 2024

(30) Foreign Application Priority Data
Dec. 8, 2022   (JP) ................................ 2022-196535

(51) Int. Cl.
H03K 17/567      (2006.01)
(52) U.S. Cl.
CPC ... *H03K 17/567* (2013.01); *H03K 2217/0036* (2013.01)
(58) Field of Classification Search
CPC ......... H03K 17/567; H03K 2217/0036; H03K 17/168; H03K 17/04
See application file for complete search history.

(56) References Cited

U.S. PATENT DOCUMENTS

2021/0281258 A1 *   9/2021   Sakano ................ H03K 17/063

FOREIGN PATENT DOCUMENTS

JP       H0832064 A   *   2/1996
JP       2021141304 A       9/2021

OTHER PUBLICATIONS

Machida, "Approaching the Limit of Switching Loss Reduction in Si-IGBTs", 2014, ISPSD, IEEE, 4 pages.

* cited by examiner

*Primary Examiner* — Metasebia T Retebo
(74) *Attorney, Agent, or Firm* — Maier & Maier, PLLC

(57) ABSTRACT

The semiconductor drive device includes a third turn-off gate resistor that is electrically connected to the third gate electrode of each of the first semiconductor device and the second semiconductor device, and that is inserted into a third turn-off interconnect configured to apply a potential for turning off the third gate electrode. And $$R_{CGsoff} \leq \frac{Vth3}{\min(C_{CGsgc})\frac{dv}{dt}} \quad (1)$$

where, in each of the first semiconductor device and the second semiconductor device, a threshold voltage of the third gate electrode being Vth3, a resistance value of the third turn-off gate resistor being $R_{CGsoff}$, a minimum value of a capacitance between the third gate electrode and the collector electrode in a voltage dependence characteristic being min ($C_{CGsgc}$), and a time displacement of a voltage at a time of turning on being dv/dt.

11 Claims, 4 Drawing Sheets

SEMICONDUCTOR DRIVE DEVICE AND SEMICONDUCTOR MODULE

CROSS-REFERENCE TO RELATED APPLICATION

This application is based upon and claims the benefit of priority from Japanese Patent Application No. 2022-196535, filed on Dec. 8, 2022; the entire contents of which are incorporated herein by reference.

FIELD

Embodiments described herein relate generally to a semiconductor drive device and a semiconductor module.

BACKGROUND

An insulated gate bipolar transistor (IGBT) is widely used as a power semiconductor device having a large breakdown voltage that controls a large current. The IGBT used as a switching element is desired to have a low on-voltage and a low switching loss at a time of turn-on and turn-off. As a method for reducing the turn-off loss while maintaining the on-voltage low, there is a double gate structure in which gate electrodes are separately formed in two systems and one of the gate electrodes is turned off first. However, since short-circuit resistance decreases when a channel density is increased, it is less likely to reduce the turn-on loss. Therefore, an IGBT has been proposed in which the gate electrodes are divided into three systems, and the gate electrodes of the third system are driven only when the gate electrodes are turned on, thereby reducing the turn-on loss.

DETAILED DESCRIPTION

According to one embodiment, a semiconductor drive device drives a first semiconductor device and a second semiconductor device each including a collector electrode, an emitter electrode, a first gate electrode, a second gate electrode, and a third gate electrode. The first gate electrode, the second gate electrode, and the third gate electrode are independently controlled. In a period from when the first gate electrode is turned on to when the first gate electrode is turned off, a turn-on period of the second gate electrode is less than a turn-on period of the first gate electrode, and a turn-on period of the third gate electrode is less than the turn-on period of the second gate electrode. The semiconductor drive device includes a third turn-off gate resistor that is electrically connected to the third gate electrode of each of the first semiconductor device and the second semiconductor device, and that is inserted into a third turn-off interconnect configured to apply a potential for turning off the third gate electrode. And $$R_{CGsoff} \leq \frac{Vth3}{\min(C_{CGsgc}) \frac{dv}{dt}} \quad (1)$$

where, in each of the first semiconductor device and the second semiconductor device, a threshold voltage of the third gate electrode being Vth3, a resistance value of the third turn-off gate resistor being $R_{CGsoff}$, a minimum value of a capacitance between the third gate electrode and the collector electrode in a voltage dependence characteristic being min ($C_{CGsgc}$), and a time displacement of a voltage at a time of turning on being dv/dt.

Hereinafter, an embodiment will be described with reference to the drawings.

The drawings are schematic or conceptual, and the relationship between the thickness and the width of each portion, the ratio of sizes among portions, and the like are not necessarily the same as the actual ones. Dimensions and ratios even for identical portions may be shown differently depending on drawings.

Further, the same components are denoted by the same reference signs.

Figure 1:
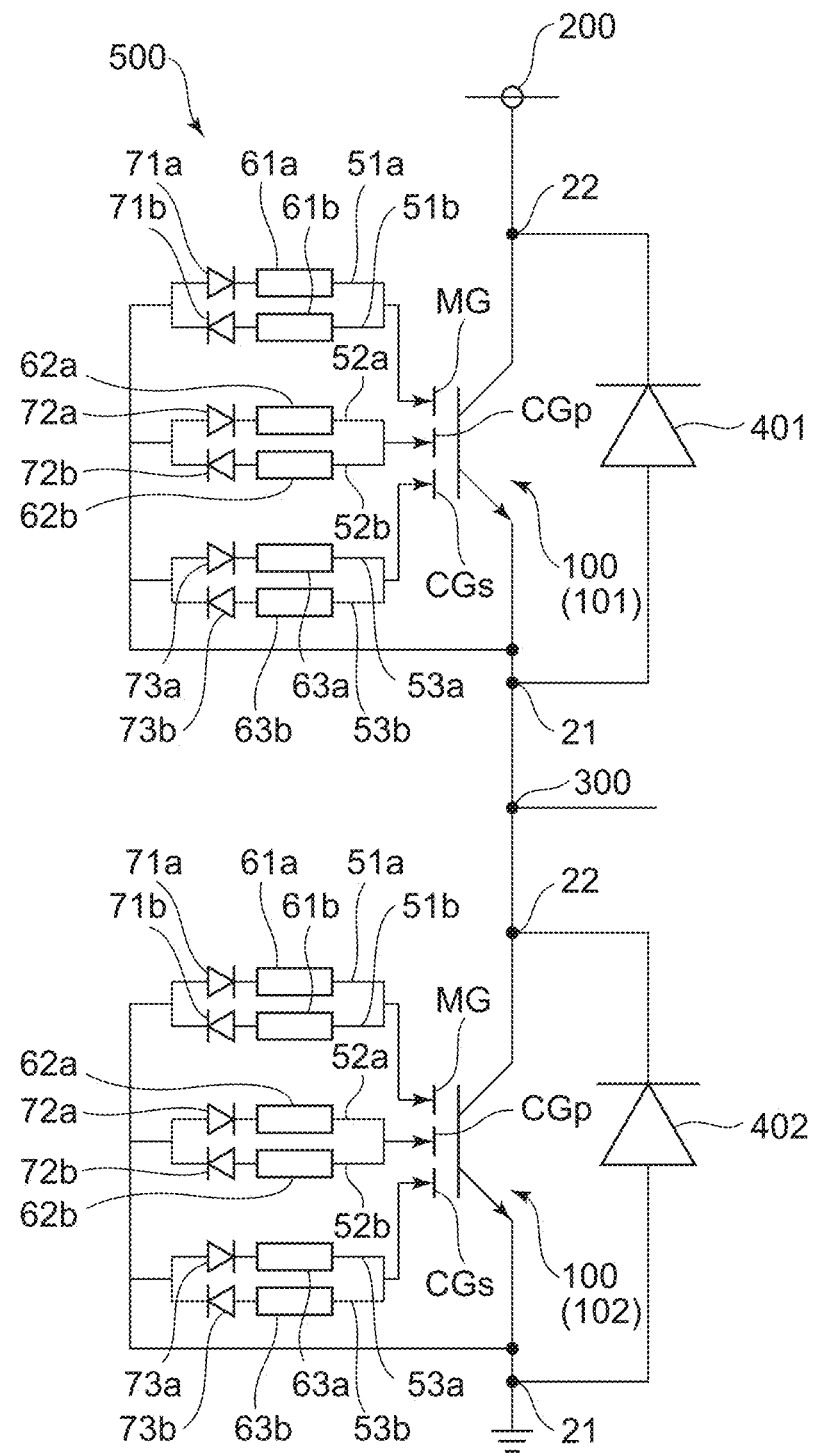
FIG. 1 and FIG. 2 are circuit diagrams of a semiconductor module of an embodiment.

As shown in FIG. 1, a semiconductor module of the embodiment includes a first semiconductor device 101, a second semiconductor device 102, and a semiconductor drive device 500 that drives the first semiconductor device 101 and the second semiconductor device 102. FIG. 1 mainly shows portions of the semiconductor drive device 500 connected to gate electrodes of the first semiconductor device 101 and the second semiconductor device 102.

The first semiconductor device 101 and the second semiconductor device 102 are, for example, IGBTs, and have the same configuration. In the specification, the first semiconductor device 101 and the second semiconductor device 102 may be simply referred to as a semiconductor device 100 without being distinguished from each other.

Each of the first semiconductor device 101 and the second semiconductor device 102 includes a collector electrode 22, an emitter electrode 21, a first gate electrode MG, a second gate electrode CGp, and a third gate electrode CGs. The first gate electrode MG, the second gate electrode CGp, and the third gate electrode CGs are electrically independent of one another.

The first semiconductor device 101 and the second semiconductor device 102 are connected in series between a voltage source and a ground. The collector electrode 22 of the first semiconductor device 101 is connected to the voltage source 200, the emitter electrode 21 of the first semiconductor device 101 is connected to the collector electrode 22 of the second semiconductor device 102, and the emitter electrode 21 of the second semiconductor device 102 is connected to the ground. A connection point (a neutral point) 300 between the emitter electrode 21 of the first semiconductor device 101 and the collector electrode 22 of the second semiconductor device 102 is connected to a load (not shown).

A first freewheeling diode 401 is connected in parallel to the first semiconductor device 101 between the voltage source 200 and the neutral point 300. A direction from the neutral point 300 toward the voltage source 200 is a forward direction of the first freewheeling diode 401. A second freewheeling diode 402 is connected in parallel to the second semiconductor device 102 between the neutral point 300 and the ground. A direction from the ground toward the neutral point 300 is a forward direction of the second freewheeling diode 402. The first freewheeling diode 401 and the second freewheeling diode 402 are, for example, Schottky barrier diodes.

The semiconductor drive device 500 includes first turn-on interconnects 51a that apply potentials to turn on the first gate electrodes MG, first turn-off interconnects 51b that apply potentials to turn off the first gate electrodes MG, second turn-on interconnects 52a that apply potentials to turn on the second gate electrodes CGp, second turn-off interconnects 52b that apply potentials to turn off the second gate electrodes CGp, third turn-on interconnects 53a that apply potentials to turn on the third gate electrodes CGs, and third turn-off interconnects 53b that apply potentials to turn off the third gate electrodes CGs.

The semiconductor drive device 500 further includes first turn-on gate resistors 61a electrically connected to the first gate electrodes MG and inserted into the first turn-on interconnects 51a, first turn-off gate resistors 61b electrically connected to the first gate electrodes MG and inserted into the first turn-off interconnects 51b, second turn-on gate resistors 62a electrically connected to the second gate electrodes CGp and inserted into the second turn-on interconnects 52a, second turn-off gate resistors 62b electrically connected to the second gate electrodes CGp and inserted into the second turn-off interconnects 52b, third turn-on gate resistors 63a electrically connected to the third gate electrodes CGs and inserted into the third turn-on interconnects 53a, and third turn-off gate resistors 63b electrically connected to the third gate electrodes CGs and inserted into the third turn-off interconnects 53b. The turn-on gate resistors and the turn-off gate resistors are resistance elements or interconnect resistors.

The semiconductor drive device 500 further includes turn-on diodes 71a, 72a, and 73a that are inserted into the turn-on interconnects 51a, 52a, and 53a and that are connected in series to the turn-on gate resistors 61a, 62a, and 63a, and turn-off diodes 71b, 72b, and 73b that are inserted into the turn-off interconnects 51b, 52b, and 53b and that are connected in series to the turn-off gate resistors 61b, 62b, and 63b. Cathodes of the turn-on diodes 71a, 72a, and 73a are connected to the gate electrodes MG, CGp, and CGs via the turn-on gate resistors 61a, 62a, and 63a, respectively. Anodes of the turn-off diodes 71b, 72b, and 73b are connected to the gate electrodes MG, CGp, and CGs via the turn-off gate resistors 61b, 62b, and 63b, respectively. The turn-on gate resistors 61a, 62a, and 63a may be connected to the gate electrodes MG, CGp, and CGs via the turn-on diodes 71a, 72a, and 73a, respectively. The turn-off gate resistors 61b, 62b, and 63b may be connected to the gate electrodes MG, CGp, and CGs via the turn-off diodes 71b, 72b, and 73b, respectively. The turn-on diodes and the turn-off diodes are diode elements, and types thereof are not limited.

A current path when the gate electrodes MG, CGp, and CGs are turned on and a current path when the gate electrodes MG, CGp, and CGs are turned off are provided separately. The current path for turning on the gate electrodes MG, CGp, and CGs includes the turn-on interconnects 51a, 52a, and 53a, the turn-on gate resistors 61a, 62a, and 63a, and the turn-on diodes 71a, 72a, and 73a. The current path for turning off the gate electrodes MG, CGp, and CGs includes the turn-off interconnects 51b, 52b, and 53b, the turn-off gate resistors 61b, 62b, and 63b, and the turn-off diodes 71b, 72b, and 73b.

Figure 2:
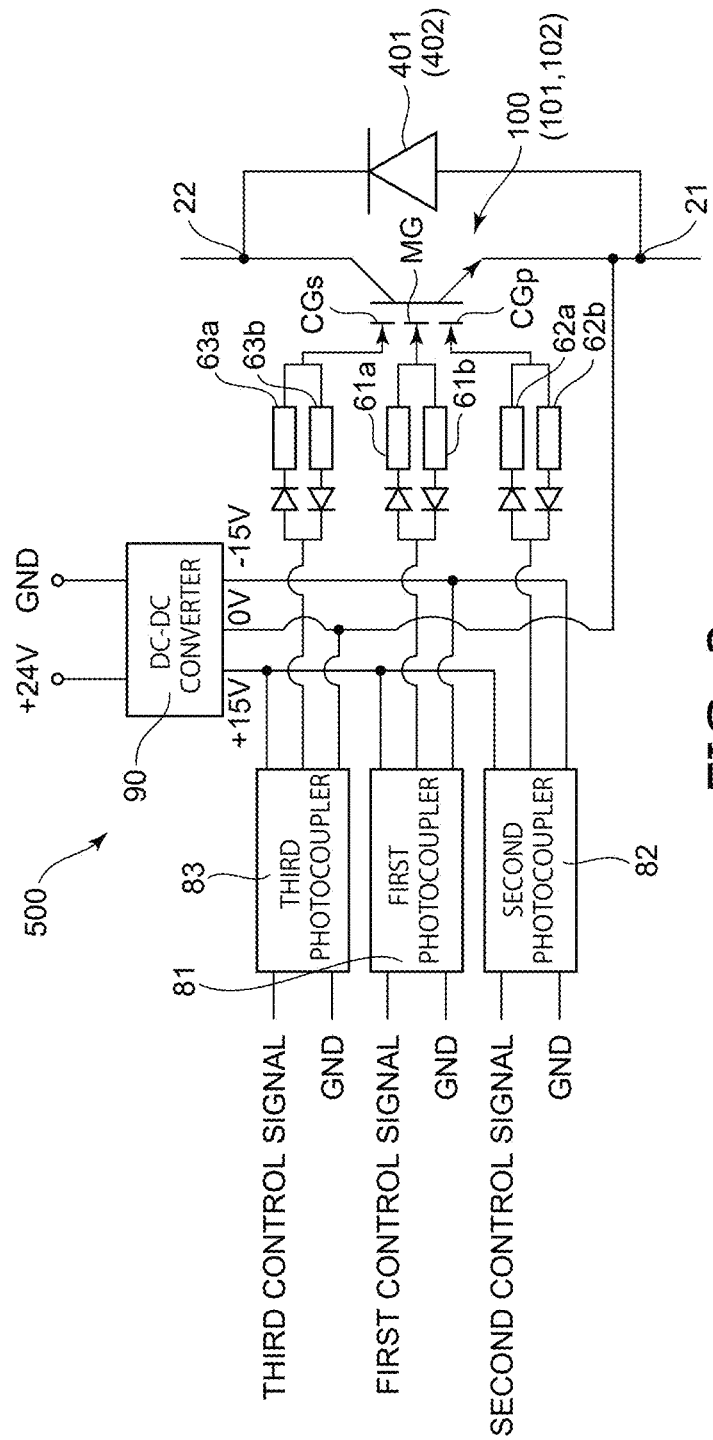

As shown in FIG. 2, the semiconductor drive device 500 further includes a first photocoupler 81, a second photocoupler 82, a third photocoupler 83, and a DC-DC converter 90. In FIG. 1, the first photocoupler 81, the second photocoupler 82, the third photocoupler 83, and the DC-DC converter 90 are omitted.

The DC-DC converter 90 outputs, for example, +15 V as a high-level potential, and −15 V and 0 V as a low-level potential. The potential or the voltage is expressed based on an emitter potential.

The first photocoupler 81 receives an input of a first control signal and switches between a state in which the first gate electrode MG and the high-level potential (+15 V) of the DC-DC converter 90 are short-circuited and a state in which the first gate electrode MG and the low-level potential (−15 V) of the DC-DC converter 90 are short-circuited.

The second photocoupler 82 receives an input of a second control signal and switches between a state in which the second gate electrode CGp and the high-level potential (+15 V) of the DC-DC converter 90 are short-circuited and a state in which the second gate electrode CGp and the low-level potential (−15 V) of the DC-DC converter 90 are short-circuited.

The third photocoupler 83 receives an input of a third control signal and switches between a state in which the third gate electrode CGs and the high-level potential (+15 V) of the DC-DC converter 90 are short-circuited and a state in which the third gate electrode CGs and 0 V of the DC-DC converter 90 are short-circuited.

The first control signal, the second control signal, and the third control signal are, for example, pulse signals.

Next, an example of a structure of the semiconductor device 100 (the first semiconductor device 101 and the second semiconductor device 102) will be described with reference to FIG. 3.

The semiconductor device 100 has, for example, a trench gate structure. The semiconductor device 100 includes the emitter electrode 21, the collector electrode 22, a semiconductor unit 10, the first gate electrodes MG, the second gate electrode CGp, the third gate electrodes CGs, first insulating films 41, second insulating films 42, and third insulating films 43. In FIG. 3, the emitter electrode 21 is indicated by a two-dot chain line to clearly show a surface of the semiconductor unit 10 covered with the emitter electrode 21.

The emitter electrode 21 and the collector electrode 22 are separated from each other in a first direction Z. In FIG. 3, two directions orthogonal to the first direction Z are referred to as a second direction X and a third direction Y. The second direction X and the third direction Y are orthogonal to each other.

The semiconductor unit 10 is provided between the emitter electrode 21 and the collector electrode 22 in the first direction Z. A material of the semiconductor unit 10 is, for example, silicon.

As the material of the semiconductor unit 10, for example, silicon carbide and gallium nitride may be used.

The semiconductor unit 10 includes a first semiconductor layer 11 of a first conductivity type, second semiconductor layers 12 of a second conductivity type, third semiconductor layers 13 of the first conductivity type, and a fourth semiconductor layer 14 of the second conductivity type. In the embodiment, for example, the first conductivity type is an n-type, and the second conductivity type is a p-type.

The semiconductor unit 10 includes multiple mesa portions 30 located apart from one another in the second direction X. The mesa portions 30 extend in the third direction Y. Each of the mesa portions 30 includes a part of the first semiconductor layer 11, the second semiconductor layer 12, and the third semiconductor layers 13.

The first semiconductor layer 11 is, for example, an n-type drift layer in the IGBT. The second semiconductor layer 12 is, for example, a p-type base layer in the IGBT. The second semiconductor layer 12 is provided between the first semiconductor layer 11 and the third semiconductor layer 13 in the first direction Z.

The third semiconductor layer 13 is, for example, an n-type emitter layer in the IGBT. An n-type impurity concentration of the third semiconductor layer 13 is larger than an n-type impurity concentration of the first semiconductor layer 11. The third semiconductor layer 13 is provided between the second semiconductor layer 12 and the emitter electrode 21 in the first direction Z and is electrically connected to the emitter electrode 21.

The fourth semiconductor layer 14 is, for example, a p-type collector layer in the IGBT. A p-type impurity concentration of the fourth semiconductor layer 14 is larger than a p-type impurity concentration of the second semiconductor layer 12. The fourth semiconductor layer 14 is provided between the collector electrode 22 and the first semiconductor layer 11 in the first direction Z and is electrically connected to the collector electrode 22.

The semiconductor unit 10 may further include fifth semiconductor layers 15 of the second conductivity type and a sixth semiconductor layer 16 of the first conductivity type.

The fifth semiconductor layer 15 is, for example, a p-type base contact layer in the IGBT. A p-type impurity concentration of the fifth semiconductor layer 15 is larger than the p-type impurity concentration of the second semiconductor layer 12. The fifth semiconductor layer 15 is provided between the second semiconductor layer 12 and the emitter electrode 21 and is electrically connected to the emitter electrode 21. The fifth semiconductor layer 15 is provided in the mesa portion 30. For example, on the second semiconductor layer 12 of the mesa portion 30, the third semiconductor layer 13 and the fifth semiconductor layer 15 are alternately disposed in the third direction Y.

The sixth semiconductor layer 16 is, for example, an n-type buffer layer in the IGBT. An n-type impurity concentration of the sixth semiconductor layer 16 is larger than the n-type impurity concentration of the first semiconductor layer 11. The sixth semiconductor layer 16 is provided between the fourth semiconductor layer 14 and the first semiconductor layer 11 in the first direction Z.

The first gate electrode MG, the second gate electrode CGp, and the third gate electrode CGs are provided between the semiconductor unit 10 and the emitter electrode 21 in the first direction Z. The first gate electrode MG, the second gate electrode CGp, and the third gate electrode CGs are electrically separated from one another. Examples of materials of the first gate electrode MG, the second gate electrode CGp, and the third gate electrode CGs include polycrystalline silicon.

Figure 3:
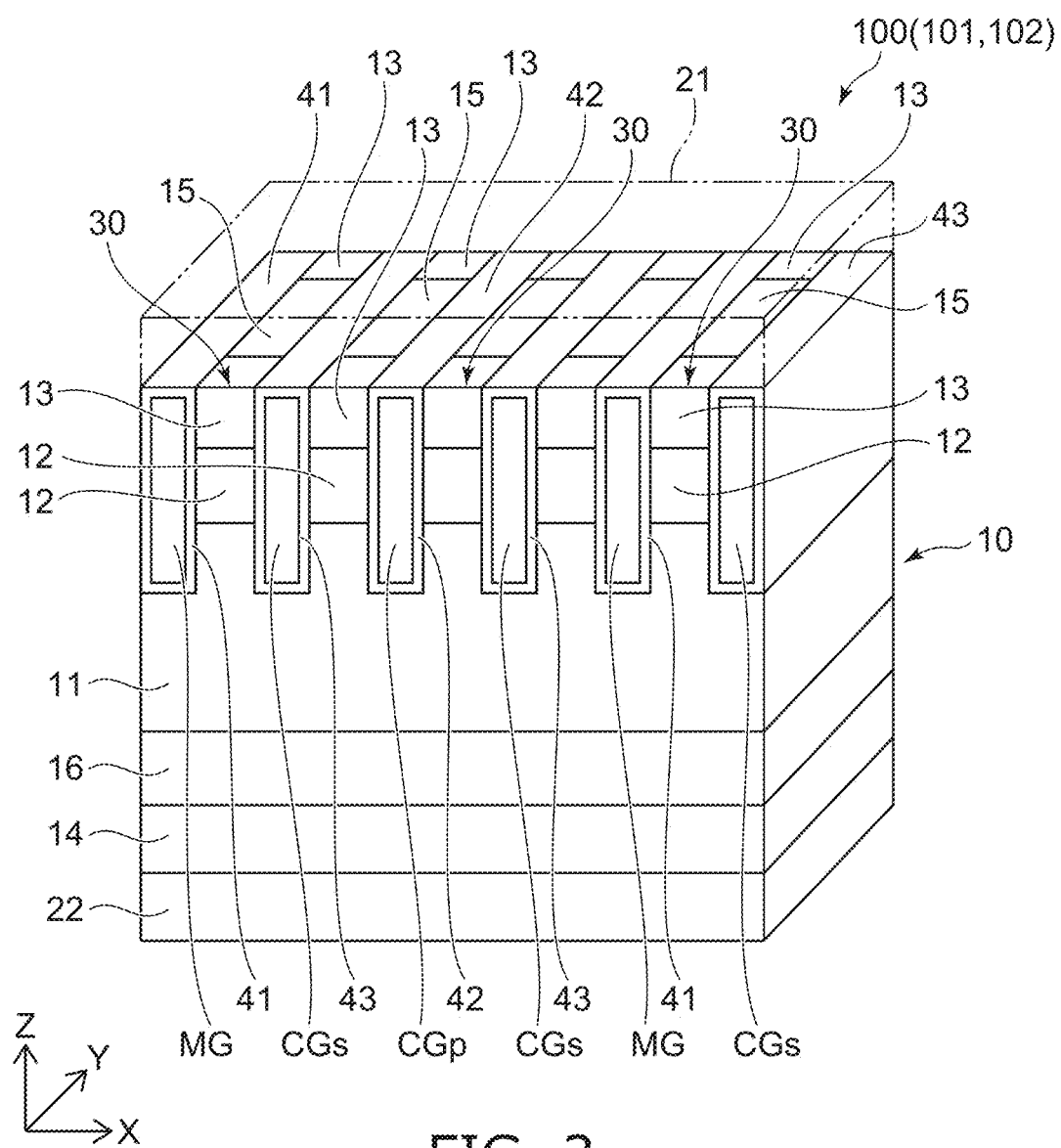
FIG. 3 is a cross-sectional perspective view of a semiconductor device of the embodiment.

The structure shown in FIG. 3 is repeated many times in the second direction X. That is, the multiple first gate electrodes MG, the multiple second gate electrodes CGp, and the multiple third gate electrodes CGs are separated from one another in the second direction X. The first gate electrode MG, the second gate electrode CGp, and the third gate electrode CGs extend in the third direction Y. For example, the multiple first gate electrodes MG, the multiple second gate electrodes CGp, and the multiple third gate electrodes CGs are electrically connected to the same type of gate electrodes on ends in the third direction Y. The third gate electrode CGs is disposed, for example, between the first gate electrode MG and the second gate electrode CGp adjacent to each other in the second direction X.

The first insulating film 41 is provided between the first gate electrode MG and the semiconductor unit 10. The first gate electrode MG is adjacent to the mesa portions 30 via the first insulating film 41 in the second direction X. A side surface of the first gate electrode MG in the second direction X faces the first semiconductor layer 11, the second semiconductor layer 12, the third semiconductor layers 13, and the fifth semiconductor layer 15 of the mesa portion 30 via the first insulating film 41. The first insulating film 41 is also provided between an upper end of the first gate electrode MG and the emitter electrode 21.

The second insulating film 42 is provided between the second gate electrode CGp and the semiconductor unit 10. The second gate electrode CGp is adjacent to the mesa portions 30 via the second insulating film 42 in the second direction X. A side surface of the second gate electrode CGp in the second direction X faces the first semiconductor layer 11, the second semiconductor layer 12, the third semiconductor layers 13, and the fifth semiconductor layer 15 of the mesa portion 30 via the second insulating film 42. The second insulating film 42 is also provided between an upper end of the second gate electrode CGp and the emitter electrode 21.

The third insulating film 43 is provided between the third gate electrode CGs and the semiconductor unit 10. The third gate electrode CGs is adjacent to the mesa portions 30 via the third insulating film 43 in the second direction X. A side surface of the third gate electrode CGs in the second direction X faces the first semiconductor layer 11, the second semiconductor layer 12, the third semiconductor layers 13, and the fifth semiconductor layer 15 of the mesa portion 30 via the third insulating film 43. The third insulating film 43 is also provided between an upper end of the third gate electrode CGs and the emitter electrode 21.

The first insulating film 41, the second insulating film 42, and the third insulating film 43 are, for example, silicon oxide films or silicon nitride films.

The first semiconductor device 101 and the second semiconductor device 102 are alternately turned on and off by the semiconductor drive device 500. The second semiconductor device 102 is turned off during a period in which the first semiconductor device 101 is turned on, and the first semiconductor device 101 is turned off during a period in which the second semiconductor device 102 is turned on. Further, to prevent a through current from flowing to the ground via the first semiconductor device 101 and the second semiconductor device 102 from the voltage source 200, a dead time that is a period in which both the first semiconductor device 101 and the second semiconductor device 102 are turned off is set.

Figure 4A:
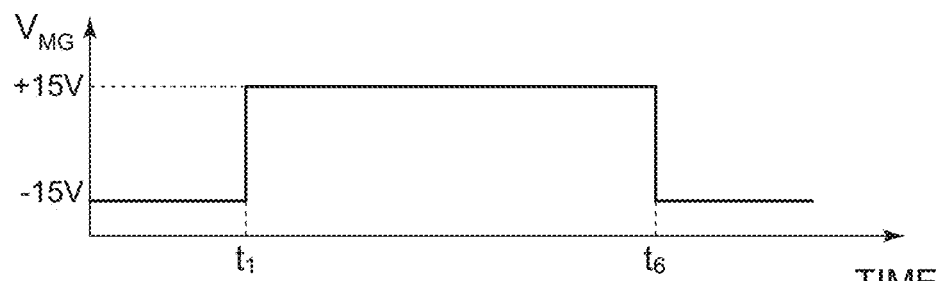
FIG. 4A to FIG. 4C are timing charts showing an example of a control method of the semiconductor device of the embodiment.
Figure 4B:
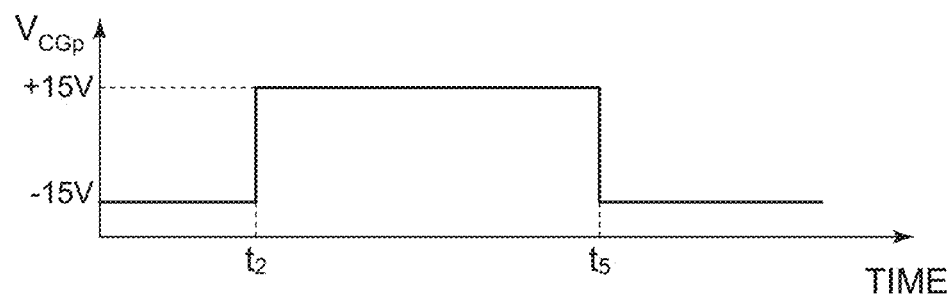
Figure 4C:
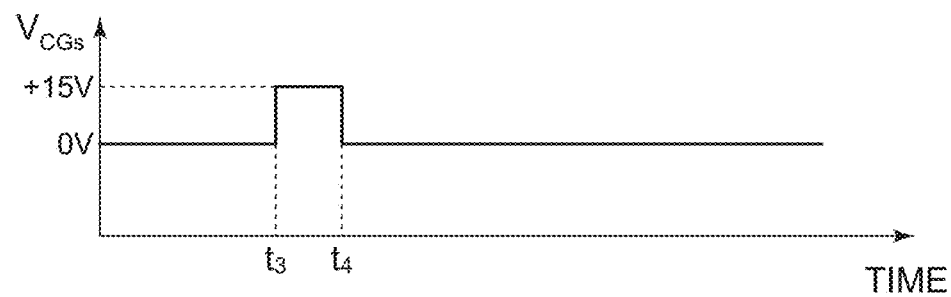

FIGS. 4A to 4C are timing charts showing an example of a method for controlling the semiconductor device 100. FIG. 4A shows a first gate potential $V_{MG}$ applied to the first gate electrode MG. FIG. 4B shows a second gate potential $V_{CGp}$ applied to the second gate electrode CGp. FIG. 3C shows a third gate potential $V_{CGs}$ applied to the third gate electrode CGs. FIGS. 4A to 4C show output signals at first to third gate electrode connection units of the semiconductor drive device 500.

The first gate electrode MG, the second gate electrode CGp, and the third gate electrode CGs are independently controlled. In a period (a period from a first time point t1 to a sixth time point t6) from when the first gate electrode MG is turned on to when the first gate electrode MG is turned off, a turn-on period (a period from a second time point t2 to a fifth time point t5) of the second gate electrode CGp is shorter than a turn-on period of the first gate electrode MG, and a turn-on period (a period from a third time point t3 to a fourth time point t4) of the third gate electrode CGs is shorter than the turn-on period of the second gate electrode CGp.

The semiconductor device 100 is turned on and off by the first gate electrode MG. That is, the semiconductor device 100 is turned on at the first time point t1 and turned off at the sixth time point t6. The second gate electrode CGp is turned off earlier than the first gate electrode MG when the semiconductor device 100 is turned off. The third gate electrode CGs is turned on only for a short time when the semiconductor device 100 is turned on.

At the first time point t1, the first gate potential $V_{MG}$ applied to the first gate electrode MG is set to be larger than a first threshold voltage of the first gate electrode MG. Accordingly, a first channel (an n-type inversion layer) is induced in a region of the second semiconductor layers 12 facing the first gate electrode MG. Electrons are injected from the emitter electrode 21 into the first semiconductor layer 11 via the third semiconductor layer 13 and the first channel. Accordingly, a hole is injected from the fourth semiconductor layer 14 into the first semiconductor layer 11 via the sixth semiconductor layer 16. This state is referred to as turn-on of the first gate electrode MG.

At the second time point t2, the second gate potential $V_{CGp}$ applied to the second gate electrode CGp is set to be larger than a second threshold voltage of the second gate electrode CGp. Accordingly, a second channel (an n-type inversion layer) is induced in a region of the second semiconductor layer 12 facing the second gate electrode CGp. Electrons are injected from the emitter electrode 21 into the first semiconductor layer 11 via the third semiconductor layer 13 and the second channel. Accordingly, a hole is injected from the fourth semiconductor layer 14 into the first semiconductor layer 11 via the sixth semiconductor layer 16. This state is referred to as turn-on of the second gate electrode CGp.

At the third time point t3, the third gate potential $V_{CGs}$ applied to the third gate electrode CGs is set to be larger than a third threshold voltage of the third gate electrode CGs. Accordingly, a third channel (an n-type inversion layer) is induced in a region of the second semiconductor layer 12 facing the third gate electrode CGs. Electrons are injected from the emitter electrode 21 into the first semiconductor layer 11 via the third semiconductor layer 13 and the third channel. Accordingly, a hole is injected from the fourth semiconductor layer 14 into the first semiconductor layer 11 via the sixth semiconductor layer 16. This state is referred to as turn-on of the third gate electrode CGs.

For example, the first time point t1 and the second time point t2 are at the same time point, and the third time point t3 is later than the first time point t1 and the second time point t2. The first time point t1, the second time point t2, and the third time point t3 may be set to the same timing or may be set to different timings. When the semiconductor device 100 is turned on, by turning on the first gate electrode MG, the second gate electrode CGp, and the third gate electrode CGs, an amount of the electrons injected into the first semiconductor layer 11 can be increased in a short time to reduce the turn-on loss. By setting the third time point t3 to be later than the first time point t1 and the second time point t2, a turn-on time difference due to a turn-off potential difference between the first gate electrode MG, the second gate electrode CGp, and the third gate electrode CGs can be adjusted. During a turn-on period other than a time of turning on the semiconductor device 100, by turning off the third gate electrode CGs (eliminating the third channel), a saturation current can be kept low, and short-circuit resistance can be ensured.

At the fourth time point t4 later than the first time point t1, the second time point t2, and the third time point t3, the third gate potential $V_{CGs}$ is set less than the third threshold voltage. Accordingly, the third channel in the region of the second semiconductor layer 12 facing the third gate electrode CGs disappears. This state is referred to as turn-off of the third gate electrode CGs.

At the fifth time point t5 later than the fourth time point t4, the second gate potential $V_{CGp}$ is set less than the second threshold voltage. Accordingly, the second channel in the region of the second semiconductor layer 12 facing the second gate electrode CGp disappears. This state is referred to as turn-off of the second gate electrode CGp. By turning off the second gate electrode CGp earlier than the first gate electrode MG, the amount of the electrons injected into the first semiconductor layer 11 can be reduced, and a turn-off loss can be reduced.

At the sixth time point t6 later than the fifth time point t5, the first gate potential $V_{MG}$ is set less than the first threshold voltage. Accordingly, the first channel in the region of the second semiconductor layer 12 facing the first gate electrode MG disappears. This state is referred to as turn-off of the first gate electrode MG.

A period between the fourth time point t4 and the fifth time point t5 is longer than a period between the fifth time point t5 and the sixth time point t6.

For example, a first threshold voltage Vth1 of the first gate electrode MG, a second threshold voltage Vth2 of the second gate electrode CGp, and a third threshold voltage Vth3 of the third gate electrode CGs can be the same.

The third gate electrode CGs is controlled at two potential levels. When the third gate potential $V_{CGs}$ is 0 V, the third gate electrode CGs is turned off.

When a first semiconductor device that is a high-side element and a second semiconductor device that is a low-side element are alternately switched, generally, when a gate potential is 0 V, a problem of erroneous firing of a semiconductor device may occur.

From the dead time when both the first semiconductor device 101 and the second semiconductor device 102 are turned off, at a timing at which the first semiconductor device 101 is turned on, a potential (for example, 600 V) of the voltage source 200 is applied to the neutral point 300, and a potential change (dv/dt) of the neutral point 300 is steep. At this time, a current i represented by a parasitic capacitance C between a gate electrode and a collector electrode of the second semiconductor device 102×the (dv/dt) flows through the gate electrode of the second semiconductor device 102, and a voltage V represented by gate resistance R×the current i is applied to the gate electrode of the second semiconductor device 102. When the voltage V is larger than a threshold voltage of the gate electrode of the second semiconductor device 102, the second semiconductor device 102 may be erroneously fired.

Conversely, from the dead time when both the first semiconductor device 101 and the second semiconductor device 102 are turned off, at a timing at which the second semiconductor device 102 is turned on, the potential of the neutral point 300 sharply changes from the potential (for example, 600 V) of the voltage source 200 to 0 V. At this time, the current i represented by the parasitic capacitance C between a gate electrode and a collector electrode of the first semiconductor device 101×the potential change (dv/dt) of the neutral point 300 flows through the gate electrode of the first semiconductor device 101, and the voltage V represented by the gate resistance R×the current i is applied to the gate electrode of the first semiconductor device 101. When the voltage V is larger than a threshold voltage of the gate electrode of the first semiconductor device 101, the first semiconductor device 101 may be erroneously fired.

To prevent the erroneous firing, it is conceivable to control the gate potential to a negative potential during a period of the dead time. However, controlling the gate electrode at three potential levels (for example, +15 V, 0 V, and −15 V) increases the number of components of a drive device, which increases a cost. In addition, a user needs to generate complicated control pulses, which causes a decrease in userability.

To prevent the erroneous firing, it is conceivable to reduce gate resistance. However, when the gate resistance is reduced, the electrons are rapidly discharged at a time of turning off, a higher potential is generated in the holes remaining near a bottom portion of the trench gate, and there is a concern of occurrence of an avalanche.

The inventors focused on a fact that in the semiconductor device 100 including a triple gate IGBT structure as described above, a turn-off characteristic of the semiconductor device 100 is dominated by a falling speed of the first gate electrode MG, that is, a resistance value of the first turn-off gate resistor 61b connected to the first gate electrode MG, and a resistance value of the third turn-off gate resistor 63b connected to the third gate electrode CGs is not related to the turn-off characteristic of the semiconductor device 100. When the resistance value of the first turn-off gate resistor 61b is reduced, the above-described avalanche may occur. However, even when the third gate electrode CGs which does not affect a switching behavior is caused to fall at a higher speed, that is, even when the resistance value of the third turn-off gate resistor 63b is reduced, the avalanche is less likely to be generated.

Therefore, according to the embodiment, in each of the first semiconductor device 101 and the second semiconductor device 102, a resistance value $R_{CGsoff}$ of the third turn-off gate resistor 63b is reduced such that a voltage (a voltage applied to the third gate electrode CGs of the other semiconductor device) represented by a product ($R_{CGsoff}$×i) of the current i flowing via a parasitic capacitance between the third gate electrode CGs and the collector electrode 22 of the other semiconductor device when one semiconductor device is turned on and the resistance value $R_{CGsoff}$ of the third turn-off gate resistor 63b of the other semiconductor device is not more than the third threshold voltage Vth3 of the third gate electrode CGs.

Specifically, in each of the first semiconductor device 101 and the second semiconductor device 102, when a threshold voltage of the third gate electrode CGs is Vth3, a resistance value of the third turn-off gate resistor 63b is $R_{CGsoff}$, a minimum value of a capacitance between the third gate electrode CGs and the collector electrode 22 in a voltage dependence characteristic is min ($C_{CGsgc}$), and a time displacement of a voltage at a time of turning on is dv/dt, Formula (1) is satisfied.

$$R_{CGsoff} \leq \frac{Vth3}{\min(C_{CGsgc}) \frac{dv}{dt}} \quad (1)$$

The dv/dt represents the time displacement of the voltage at the neutral point 300 when one of the first semiconductor device 101 and the second semiconductor device 102 is turned on. A turn-on speed is faster when a current is small than when the current is large. Therefore, the time displacement (dv/dt) represents, for example, a peak value of the (dv/dt) at a current of ⅟₁₀ of a rated current.

The capacitance $C_{CGsgc}$ between the third gate electrode CGs and the collector electrode 22 depends on a collector voltage. The min ($C_{CGsgc}$) represents the minimum value of the capacitance $C_{CGsgc}$ depending on the collector voltage in a rated voltage, and is a value of the capacitance between the third gate electrode CGs and the collector electrode 22 at the rated voltage.

By reducing the resistance value $R_{CGsoff}$ of the third turn-off gate resistor 63b to satisfy Formula (1), it is possible to prevent the other semiconductor device from being erroneously fired at the timing at which one semiconductor device is turned on from the dead time when both the first semiconductor device 101 and the second semiconductor device 102 are turned off. The $R_{CGsoff}$ satisfying Formula (1) is, for example, 100Ω or less.

A lower limit value of $R_{CGsoff}$ can be represented by, for example, Formula (7).

$$\frac{V_{ge}}{\text{rated current}} \leq R_{CGsoff} \quad (7)$$

In Formula (7), Vge represents a voltage between the third gate electrode CGs and the emitter electrode 21 of the semiconductor device 100. Rated current represents a rated current (a rated peak of the pulse) of a drive unit (for example, the photocoupler 83 and the DC-DC converter 90 shown in FIG. 2) of the third gate electrode CGs.

When a maximum value of the capacitance between the third gate electrode and the collector electrode in the voltage dependence characteristic is max ($C_{CGsgc}$), Formula (2) can be further satisfied.

$$R_{CGsoff} \leq \frac{Vth3}{\frac{(\min(C_{CGsgc}) + \max(C_{CGsgc}))}{2} \times \frac{dv}{dt}} \quad (2)$$

The max ($C_{CGsgc}$) represents the maximum value of the capacitance $C_{CGsgc}$ depending on the collector voltage in the rated voltage, and is a value of the capacitance between the third gate electrode CGs and the collector electrode 22 at 0 V. The $R_{CGsoff}$ satisfying Formula (2) is, for example, 50Ω or less.

Formula (3) can be further satisfied.

$$R_{CGsoff} \leq \frac{Vth3}{\max(C_{CGsgc}) \frac{dv}{dt}} \quad (3)$$

The $R_{CGsoff}$ satisfying Formula (3) is, for example, 10Ω or less.

In each of the first semiconductor device 101 and the second semiconductor device 102, when the capacitance between the third gate electrode CGs and the collector electrode 22 is $C_{CGsgc}$, the resistance value of the first turn-off gate resistor 61b is $R_{MGoff}$, and a capacitance between the first gate electrode MG and the collector electrode 22 is $C_{MGgc}$, Formula (4) can be further satisfied.

$$R_{CGsoff} C_{CGsgc} \leq R_{MGoff} C_{MGgc} \quad (4)$$

In each of the first semiconductor device and the second semiconductor device, when the first threshold voltage of the first gate electrode MG is Vth1, the resistance value of the first turn-off gate resistor 61b is $R_{MGoff}$, and the maximum value of the capacitance between the first gate electrode MG and the collector electrode 22 in the voltage dependence characteristic is max ($C_{MGgc}$), Formula (5) can be further satisfied.

$$\frac{Vth1}{\max(C_{MGgc})\frac{dv}{dt}} \leq R_{MGoff} \quad (5)$$

The max ($C_{MGgc}$) represents a maximum value of the capacitance $C_{MGgc}$ between the first gate electrode MG and the collector electrode 22 depending on the collector voltage in the rated voltage, and is a value of the capacitance between the first gate electrode MG and the collector electrode 22 at 0 V.

Formula (6) can be further satisfied.

$$\frac{Vth1}{\max(C_{MGgc})\frac{dv}{dt}} \leq R_{MGoff} \leq \frac{Vth1 + |V_{-GE}|}{\min(C_{MGgc})\frac{dv}{dt}} \quad (6)$$

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor drive device for driving a first semiconductor device and a second semiconductor device each including a collector electrode, an emitter electrode, a first gate electrode, a second gate electrode, and a third gate electrode,
    the first gate electrode, the second gate electrode, and the third gate electrode being independently controlled,
    in a period from when the first gate electrode is turned on to when the first gate electrode is turned off, a turn-on period of the second gate electrode being less than a turn-on period of the first gate electrode, and a turn-on period of the third gate electrode being less than the turn-on period of the second gate electrode,
    the semiconductor drive device comprising a third turn-off gate resistor that is electrically connected to the third gate electrode of each of the first semiconductor device and the second semiconductor device, and that is inserted into a third turn-off interconnect configured to apply a potential for turning off the third gate electrode, and $$R_{CGsoff} \leq \frac{Vth3}{\min(C_{CGsgc})\frac{dv}{dt}} \quad (1)$$

where, in each of the first semiconductor device and the second semiconductor device, a threshold voltage of the third gate electrode being Vth3, a resistance value of the third turn-off gate resistor being $R_{CGsoff}$, a minimum value of a capacitance between the third gate electrode and the collector electrode in a voltage dependence characteristic being min ($C_{CGsgc}$), and a time displacement of a voltage at a time of turning on being dv/dt.

2. The device according to claim 1, wherein $$R_{CGsoff} \leq \frac{Vth3}{\frac{(\min(C_{CGsgc}) + \max(C_{CGsgc}))}{2} \times \frac{dv}{dt}} \quad (2)$$

where a maximum value of the capacitance between the third gate electrode and the collector electrode in the voltage dependence characteristic is max ($C_{CGsgc}$).

3. The device according to claim 2, wherein $$R_{CGsoff} \leq \frac{Vth3}{\max(C_{CGsgc})\frac{dv}{dt}}. \quad (3)$$

4. The device according to claim 1, further comprising:
    a first turn-off gate resistor that is electrically connected to the first gate electrode of each of the first semiconductor device and the second semiconductor device and is inserted into a first turn-off interconnect configured to apply a potential for turning off the first gate electrode, and $$R_{CGsoff}C_{CGsgc} \leq R_{MGoff}C_{MGgc} \quad (4)$$

where, in each of the first semiconductor device and the second semiconductor device, the capacitance between the third gate electrode and the collector electrode being $C_{CGsgc}$, a resistance value of the first turn-off gate resistor being $R_{MGoff}$, and a capacitance between the first gate electrode and the collector electrode being $C_{MGgc}$.

5. The device according to claim 3, further comprising:
    a first turn-off gate resistor that is electrically connected to the first gate electrode of each of the first semiconductor device and the second semiconductor device and that is inserted into a first turn-off interconnect configured to apply a potential for turning off the first gate electrode, and $$\frac{Vth1}{\max(C_{MGgc})\frac{dv}{dt}} \leq R_{MGoff} \quad (5)$$

where, in each of the first semiconductor device and the second semiconductor device, a threshold voltage of the first gate electrode being Vth1, a resistance value of the first turn-off gate resistor being $R_{MGoff}$, and a maximum value of a capacitance between the first gate electrode and the collector electrode in the voltage dependence characteristic being max ($C_{MGgc}$).

6. The device according to claim 3, further comprising:
    a first turn-off gate resistor that is electrically connected to the first gate electrode of each of the first semiconductor device and the second semiconductor device and that is inserted into a first turn-off interconnect configured to apply a potential for turning off the first gate electrode, and $$\frac{Vth1}{\max(C_{MGgc})\frac{dv}{dt}} \leq R_{MGoff} \leq \frac{Vth1 + |V_{-GE}|}{\min(C_{MGgc})\frac{dv}{dt}} \quad (6)$$

where, in each of the first semiconductor device and the second semiconductor device, a threshold voltage of the first gate electrode being Vth1, a resistance value of the first turn-off gate resistor being $R_{MGoff}$, a maximum value of a capacitance between the first gate electrode and the collector electrode in the voltage dependence characteristic being max ($C_{MGgc}$), a minimum value of the capacitance between the first gate electrode and the collector electrode in the voltage dependence characteristic being min ($C_{MGgc}$), and a voltage between the first gate electrode and the emitter electrode being $V_{-GE}$.

7. A semiconductor module comprising:
a first semiconductor device and a second semiconductor device each including a collector electrode, an emitter electrode, a first gate electrode, a second gate electrode, and a third gate electrode, the first gate electrode, the second gate electrode, and the third gate electrode being controlled independently, and in a period from when the first gate electrode is turned on to when the first gate electrode is turned off, a turn-on period of the second gate electrode being less than a turn-on period of the first gate electrode, and a turn-on period of the third gate electrode being less than the turn-on period of the second gate electrode; and
a semiconductor drive device configured to drive the first semiconductor device and the second semiconductor device,
the semiconductor drive device including a third turn-off gate resistor that is electrically connected to the third gate electrode of each of the first semiconductor device and the second semiconductor device and that is inserted into a third turn-off interconnect configured to apply a potential for turning off the third gate electrode, and $$R_{CGsoff} \leq \frac{Vth3}{\min(C_{CGsgc})\frac{dv}{dt}} \quad (1)$$

where, in each of the first semiconductor device and the second semiconductor device, a threshold voltage of the third gate electrode being Vth3, a resistance value of the third turn-off gate resistor being $R_{CGsoff}$, a minimum value of a capacitance between the third gate electrode and the collector electrode in a voltage dependence characteristic being min ($C_{CGsgc}$), and a time displacement of a voltage at a time of turning on being dv/dt.

8. A semiconductor module comprising:
the semiconductor drive device according to claim 3;
the first semiconductor device; and
the second semiconductor device.

9. The module according to claim 8, wherein
the semiconductor drive device includes a first turn-off gate resistor that is electrically connected to the first gate electrode of each of the first semiconductor device and the second semiconductor device and that is inserted into a first turn-off interconnect configured to apply a potential for turning off the first gate electrode, and $$R_{CGsoff}C_{CGsgc} \leq R_{MGoff}C_{MGgc} \quad (4)$$

where, in each of the first semiconductor device and the second semiconductor device, the capacitance between the third gate electrode and the collector electrode is $C_{CGsgc}$, a resistance value of the first turn-off gate resistor is $R_{MGoff}$, and a capacitance between the first gate electrode and the collector electrode is $C_{MGgc}$.

10. The module according to claim 8, wherein
the semiconductor drive device includes a first turn-off gate resistor that is electrically connected to the first gate electrode of each of the first semiconductor device and the second semiconductor device and that is inserted into a first turn-off interconnect configured to apply a potential for turning off the first gate electrode, and $$\frac{Vth1}{\max(C_{MGgc})\frac{dv}{dt}} \leq R_{MGoff} \quad (5)$$

where, in each of the first semiconductor device and the second semiconductor device, a threshold voltage of the first gate electrode is Vth1, a resistance value of the first turn-off gate resistor is $R_{MGoff}$, and a maximum value of a capacitance between the first gate electrode and the collector electrode in the voltage dependence characteristic is max ($C_{MGgc}$).

11. The module according to claim 8, wherein
the semiconductor drive device includes a first turn-off gate resistor that is electrically connected to the first gate electrode of each of the first semiconductor device and the second semiconductor device and that is inserted into a first turn-off interconnect configured to apply a potential for turning off the first gate electrode, and $$\frac{Vth1}{\max(C_{MGgc})\frac{dv}{dt}} \leq R_{MGoff} \leq \frac{Vth1 + |V_{-GE}|}{\min(C_{MGgc})\frac{dv}{dt}} \quad (6)$$

where, in each of the first semiconductor device and the second semiconductor device, a threshold voltage of the first gate electrode is Vth1, a resistance value of the first turn-off gate resistor is $R_{MGoff}$, a maximum value of a capacitance between the first gate electrode and the collector electrode in the voltage dependence characteristic is max ($C_{MGgc}$), a minimum value of the capacitance between the first gate electrode and the collector electrode in the voltage dependence characteristic is min ($C_{MGgc}$), and a voltage between the first gate electrode and the emitter electrode is $V_{-GE}$.

* * * * *